United States Patent
Fielden et al.

(10) Patent No.: US 9,874,623 B2
(45) Date of Patent: Jan. 23, 2018

(54) SYSTEMS AND METHODS FOR REGULARIZED RECONSTRUCTIONS IN MRI USING SIDE INFORMATION

(71) Applicant: UNIVERSITY OF VIRGINIA PATENT FOUNDATION, Charlottesville, VA (US)

(72) Inventors: Samuel W. Fielden, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1228 days.

(21) Appl. No.: 13/867,885

(22) Filed: Apr. 22, 2013

(65) Prior Publication Data
US 2013/0278261 A1 Oct. 24, 2013

Related U.S. Application Data

(60) Provisional application No. 61/636,448, filed on Apr. 20, 2012.

(51) Int. Cl.
*G01V 3/00* (2006.01)
*G01R 33/56* (2006.01)

(52) U.S. Cl.
CPC ................. *G01R 33/5608* (2013.01)

(58) Field of Classification Search
CPC ................................. G01R 33/5608
USPC ........................ 324/309, 307, 306
See application file for complete search history.

(56) References Cited

U.S. PATENT DOCUMENTS

| | | |
|---|---|---|
| 4,999,580 A | 3/1991 | Meyer et al. |
| 5,233,301 A | 8/1993 | Meyer et al. |
| 5,402,067 A | 3/1995 | Pauly et al. |
| 5,427,101 A | 6/1995 | Sachs et al. |
| 5,485,086 A | 1/1996 | Meyer et al. |
| 5,539,313 A | 7/1996 | Meyer |
| 5,617,028 A | 4/1997 | Meyer et al. |
| 5,650,723 A | 7/1997 | Meyer |
| 5,957,843 A | 9/1999 | Luk Pak et al. |
| 6,020,739 A | 2/2000 | Meyer et al. |
| 7,483,732 B2* | 1/2009 | Zhong .................. G01R 33/285 324/309 |

(Continued)

OTHER PUBLICATIONS

Buades, A. et al., "A Review of Image Denoising Algorithms, with a New One," Multiscale Model. Simul., 2005, 4(2), pp. 490-530, Society for Industrial and Applied Mathematics.

Dewaraja, Y. et al., "Regularized reconstruction in quantitative SPECT using CT side information from hybrid imaging," Phys. Med. Biol., 2010, 55, pp. 2523-2539, Institute of Physics and Engineering in Medicine.

(Continued)

*Primary Examiner* — Louis Arana
(74) *Attorney, Agent, or Firm* — Meunier Carlin & Curfman LLC (57) ABSTRACT

Systems and methods for magnetic resonance imaging (MRI) using side information for improved reconstruction are disclosed. In one aspect, in accordance with one example embodiment, images obtained using heteronuclei, such as Fluorine-19 ($^{19}F$), can be reconstructed using one or more methods to provide improved resolution and detail. The system can use anatomical proton MRI scans. The system can use multiple smoothing techniques to improve the signal-to-noise ratio (SNR). The system can also use weighted smoothing using information from anatomical proton MRI scans to improve resolution.

25 Claims, 10 Drawing Sheets

(56) References Cited

U.S. PATENT DOCUMENTS

| | | | |
|---|---|---|---|
| 7,558,612 B2 | 7/2009 | Meyer | |
| 7,583,082 B1 | 9/2009 | Hu et al. | |
| 7,642,777 B1 | 1/2010 | Meyer et al. | |
| 7,888,935 B1 | 2/2011 | Tan et al. | |
| 2003/0193337 A1 | 10/2003 | Meyer | |
| 2010/0054570 A1* | 3/2010 | Lamerichs | G01R 33/56509 |
| | | | 382/131 |
| 2015/0131884 A1* | 5/2015 | Kimura | A61B 5/055 |
| | | | 382/131 |

OTHER PUBLICATIONS

Fessler, J., "Model-Based Image Reconstruction for MRI [A review of the use of iterative algorithms]," IEEE Signal Processing Magazine, Jul. 2010, pp. 81-89, IEEE.

Flogel, U. et al., "In Vivo Monitoring of Inflammation After Cardiac and Cerebral Ischemia by Fluorine Magnetic Resonance Imaging," Circulation, 2008, 118(2), pp. 140-148, American Heart Association, Inc.

Haldar, J. et al. "Anatomically constrained reconstruction from noisy data," Magn Reson Med, 2008, 59(4), pp. 810-818, Wiley-Liss, Inc.

Lustig, M. et al., "Sparse MRI: The application of compressed sensing for rapid MR imaging," Magn Reson Med, 2007, 50(6), pp. 1182-1195, Wiley-Liss, Inc.

Rousseau, F., "A non-local approach for image super-resolution using intermodality priors," Med Image Anal., 2010, 14(4), pp. 594-605, Elsevier B.V.

* cited by examiner

SYSTEMS AND METHODS FOR REGULARIZED RECONSTRUCTIONS IN MRI USING SIDE INFORMATION

CROSS REFERENCE TO RELATED APPLICATIONS

This Application claims priority to and benefit under 35 USC §119(e) of U.S. Provisional Patent Application Ser. No. 61/636,448, entitled, "System and Method for Improving SNR and Sensitivity of 3D Fluorine Imaging with Side-Information-Constrained Regularized Reconstruction," filed Apr. 20, 2012, which is hereby incorporated by reference as if fully set forth below.

STATEMENT AS TO RIGHTS UNDER FEDERALLY-SPONSORED RESEARCH

This invention was made with government support under grant HL079110, awarded by the National Institutes of Health. The government has certain rights in the invention.

Some references, which may include patents, patent applications, and various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [4] represents the 4th reference cited in the reference list, namely, Rousseau F. A non-local approach for image super-resolution using intermodality priors. Med Image Anal. 2010 August; 14(4):594-605.

BACKGROUND

1. Field of the Disclosure

Embodiments of the present disclosure related generally to medical imaging, and more specifically to MRI imaging using a first nucleus scan constrained and regularized by a second nucleus scan.

2. Background of Related Art

Fluorine-19 ($^{19}F$) has been used for in vivo imaging. Unfortunately, when used for magnetic resonance imaging (MRI), imaging using $^{19}F$ is generally limited by low signal sensitivity and is often hindered by low signal-to-noise ratio (SNR) due, at least in part, to the limited number of $^{19}F$ nuclei that can be delivered to an area of interest. In order to obtain reasonable voxel sizes during an in vivo imaging session, for example, dozens or hundreds of averaging scans are often used, resulting in lengthy scan times.

For cellular and molecular contrast agents, the concentration of agent that actually accumulates at the region of interest is limited by, for example, dose volume, particle size, receptor concentration, ligand concentration, and ligand specificity to the desired receptors. Fluorine is advantageous because it has no tissue background signal and thus, subtraction techniques are not required for signal detection. Unfortunately, the received signal still tends to be small due to the inherently low concentrations of agent delivered to the tissue. As a result, the signal often resides at or near the noise level in a typical experiment. For this reason, $^{19}F$ MRI has been primarily used for cell tracking, either using pre-loaded cells, or through in situ labeling via macrophage phagocytosis of PFC-containing-particles in, for example, cancer, inflammation, infection, and ischemia models.

Conventionally, low SNR in $^{19}F$ imaging has been addressed, for example, by (1) optimizing the relaxation properties of the fluorine-containing molecule, (2) delivering more chemically equivalent fluorine nuclei to the region of interest by optimizing the delivery mechanism (e.g., nanoparticle formulation or ligand affinities), or (3) optimization of acquisition techniques (e.g., pulse sequence) for a particular perfluorocarbon (PFC) particle construction.

Similar SNR issues arise in other instances, however, where small quantities of contrast agent are available. Thus, there is a clear need for acquisition and reconstruction methods to be developed to efficiently generate and utilize signal arising from small volumes of contrast agent. What is needed, therefore, are advanced reconstruction techniques for improving secondary-nucleus MRIs. The system and method can use multiple nucleus scans to regularize and reconstruct images to create improved images.

It is with respect to these and other considerations that the various embodiments described below are presented.

SUMMARY

Embodiments of the present disclosure relate generally to magnetic resonance imaging (MRI), more specifically to a system and method for enhanced MRI using multiple nuclei. In some embodiments, the system can use data from proton MRI scans to smooth and reconstruct sparse Fluorine-19 ($^{19}F$) scans. The system can utilize a number of smoothing and denoising methods to improve clarity and reduce noise.

Embodiments of the present disclosure can comprise a method comprising obtaining a first magnetic resonance (MRI) image using hydrogen ($^{1}H$), obtaining a second MRI image using a secondary nucleus other than hydrogen, and reconstructing the second image using side information from the first image.

Embodiments of the present disclosure can also comprise a system comprising a magnetic resonance imaging (MRI) device, one or more processors, and at least one memory in communication with the MRI device. The memory can store computer-readable instructions that, when executed by the one or more processors, can cause the system to obtain a first magnetic resonance (MRI) image using hydrogen ($^{1}H$), obtain a second MRI image using a secondary nucleus other than hydrogen, and reconstruct the second image using side information from the first image.

Other aspects and features of embodiments of the present disclosure will become apparent to those of ordinary skill in the art, upon reviewing the following detailed description in conjunction with the accompanying figures.

DETAILED DESCRIPTION

Embodiments of the disclosed technology relate generally to magnetic resonance imaging (MRI), more specifically to a system and method for enhanced MRI using multiple nuclei. In some embodiments, the system can use data from proton MRI scans to smooth and reconstruct sparse Fluorine-19 ($^{19}$F) scans. The system can utilize a number of smoothing and denoising methods to improve clarity and reduce noise.

To simplify and clarify explanation, the system is described below a system and method comprising $^{19}$F MRI scans enhanced with "reference" proton MRI side information. One skilled in the art will recognize, however, that the disclosure is not so limited. The system can also utilize other heteronuclei scans besides $^{19}$F and other reference scans. In addition, various smoothing and denoising techniques are disclosed, but other techniques, or combinations of techniques, could also be used.

Although exemplary embodiments of the present disclosure are explained in detail, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise.

In describing exemplary embodiments, terminology will be resorted to for the sake of clarity. It is intended that each term contemplates its broadest meaning as understood by those skilled in the art and includes all technical equivalents that operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Ranges may be expressed herein as from "about" or "approximately" one particular value and/or to "about" or "approximately" another particular value. When such a range is expressed, another embodiment includes from the one particular value and/or to the other particular value. As used herein, "about" means within 20 percent or closer of a given value or range.

As discussed herein, a "subject" or "patient" may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to a human (e.g. rat, dog, pig, monkey), etc. It should be appreciated that the subject may be any applicable human patient, for example.

It is also to be understood that the mention of one or more steps of a method does not preclude the presence of additional method steps or intervening method steps between those steps expressly identified. Method steps may be performed in a different order than those described herein. Similarly, it is also to be understood that the mention of one or more components in a device or system does not preclude the presence of additional components or intervening components between those components expressly identified.

The following detailed description is directed to systems and methods for system and method for enhanced MRI using multiple nuclei. In the following detailed description, references are made to the accompanying drawings that form a part hereof and that show, by way of illustration, specific embodiments or examples. In referring to the drawings, like numerals represent like elements throughout the several figures.

As discussed above, a disadvantage to performing $^{19}$F imaging is that $^{19}$F can be difficult to deliver to target areas in sufficient quantities to provide a strong signal. As a result, $^{19}$F scans provide a low SNR, which can be difficult to distinguish over background noise. An advantage of performing $^{19}$F imaging, on the other hand, is that proton images are routinely obtained along with fluorine scans to locate the fluorine signal with respect to organs and tissues in the body. Since there is generally a high correlation between the strength of the $^{19}$F signal and organ and tissue boundaries in the body (i.e., this is where $^{19}$F tends to collect), side information from the proton localizer images can be incorporated into the fluorine reconstruction.

In some embodiments, therefore, high specificity, but low-resolution $^{19}$F images, which often contain little or no anatomical information, can be overlaid onto high-resolution $^1$H (or "proton" MRI) anatomic images. In other words, the presence of an anatomic scan can provide a large amount of side information that can be used to guide advanced reconstruction techniques to improve fluorine image reconstruction.

Figure 1A:
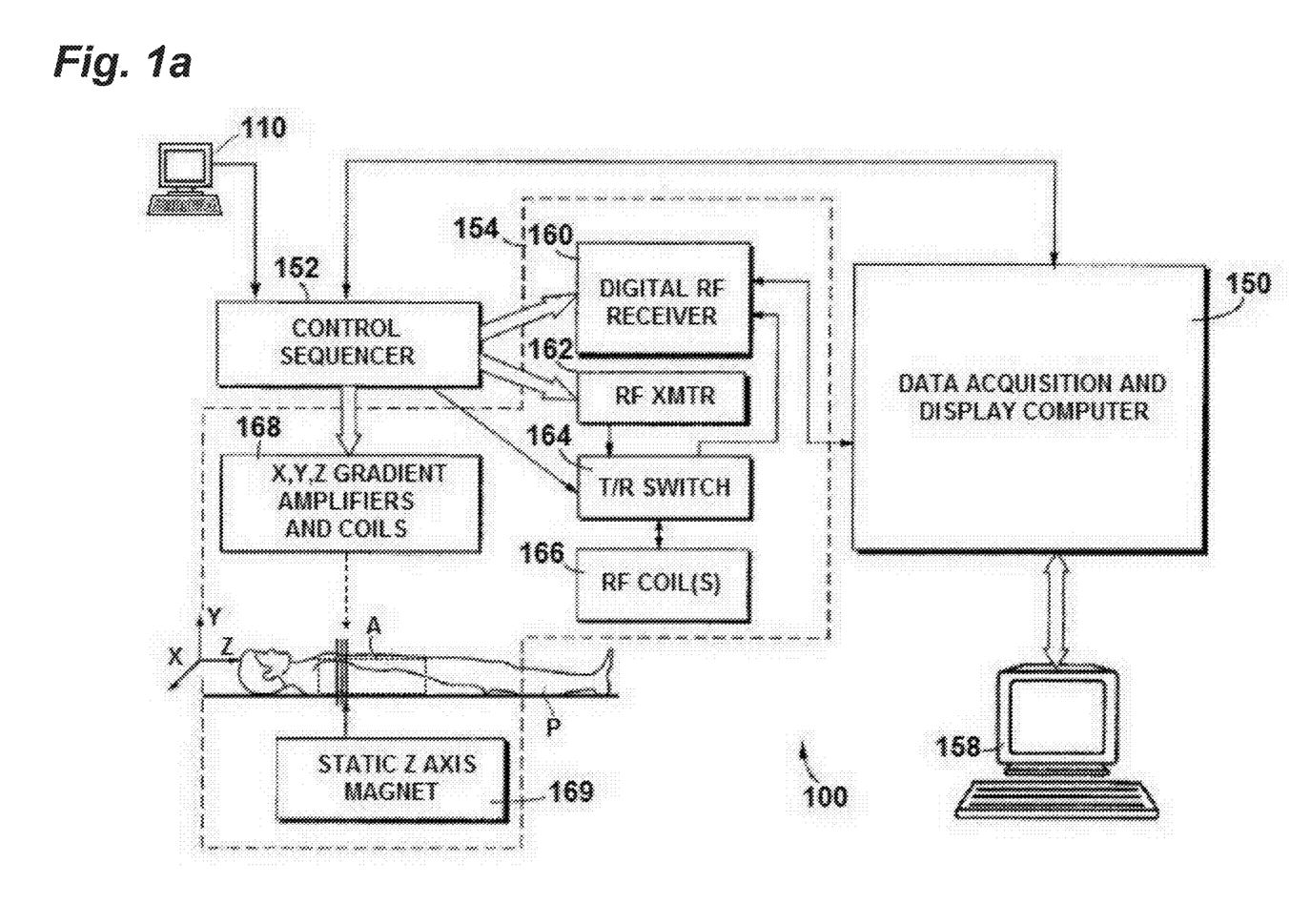
FIGS. 1A and 1B are schematics related to a conventional magnetic resonance imaging (MRI) machine.
Figure 1B:
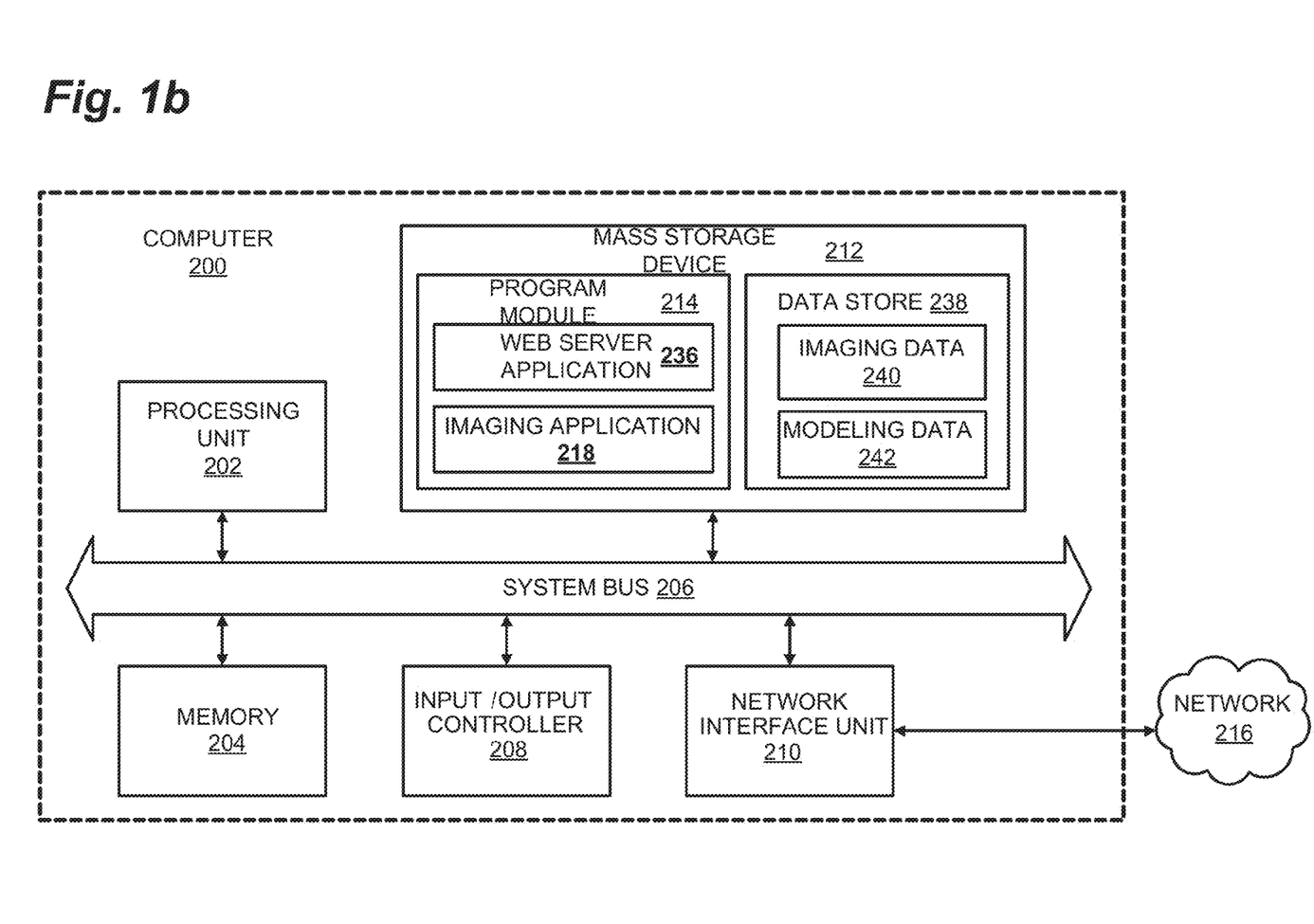

FIG. 1A is a system diagram illustrating an exemplary operating environment for the various embodiments disclosed herein. Embodiments may be implemented on a commercial MRI system. FIG. 1B illustrates an example of such an MRI system 100, including a data acquisition and display computer 150 coupled to an operator console 110, a MRI real-time control sequencer 152, and a MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158.

Area of interest A corresponds to a region associated with physiological activity in patient P. The area of interest shown in the example embodiment of FIG. 1A corresponds to a chest region of patient P. It will be appreciated that area of interest A can additionally or alternatively correspond to, but is not limited to, one or more of a brain region, cardiac region, and upper or lower limb regions of the patient P. Display 158 may be implemented through a variety of output interfaces, including a monitor, printer, or data storage. It will be appreciated that any number and type of computer-based tomography imaging systems or components, including various types of magnetic resonance imaging systems, may be used to practice aspects of the present disclosure, and the disclosure should not be limited to the exemplary type of MRI subsystem shown in FIG. 1A.

FIG. 1B is a computer architecture diagram showing illustrative computer hardware architecture for a computing system capable of implementing some embodiments presented herein. An example implementation of the computer 200 may include the data acquisition and display computer 150 of FIG. 1A. The computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform various operations discussed below, and may include a web server application 236 and an imaging application 218. The computer can include a data store 238 for storing data that may include imaging-related data 240 such as image 30 acquisition data, and a modeling data store 242 for storing imaging modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory 10 technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200.

According to various embodiments, the computer 200 may operate in a networked environment using logical connections to remote computers through a network 216. The computer 200 may connect to the network 216 through a network interface unit 210 connected to the bus 206. It should be appreciated that the network interface unit 210 may also be utilized to connect to other types of networks and remote computer systems. The computer 200 may also include an input/output controller 208 for receiving and processing input from a number of input devices. The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like.

The computer-storage media may represent memory components, whether characterized as RAM, ROM, flash, or other types of technology. The computer-storage media may also represent secondary storage, whether implemented as hard drives or otherwise. Hard drive implementations may be characterized as solid state, or may include rotating media storing magnetically-encoded information. The program modules 214, which include the imaging application 218 may include software instructions that, when loaded into the processing unit 202 and executed, cause the computer 200 to provide functions for smoothing, reconstructing, and or combining images, for example, according to aspects of the disclosure described herein in accordance with exemplary embodiments. The program modules may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 2:
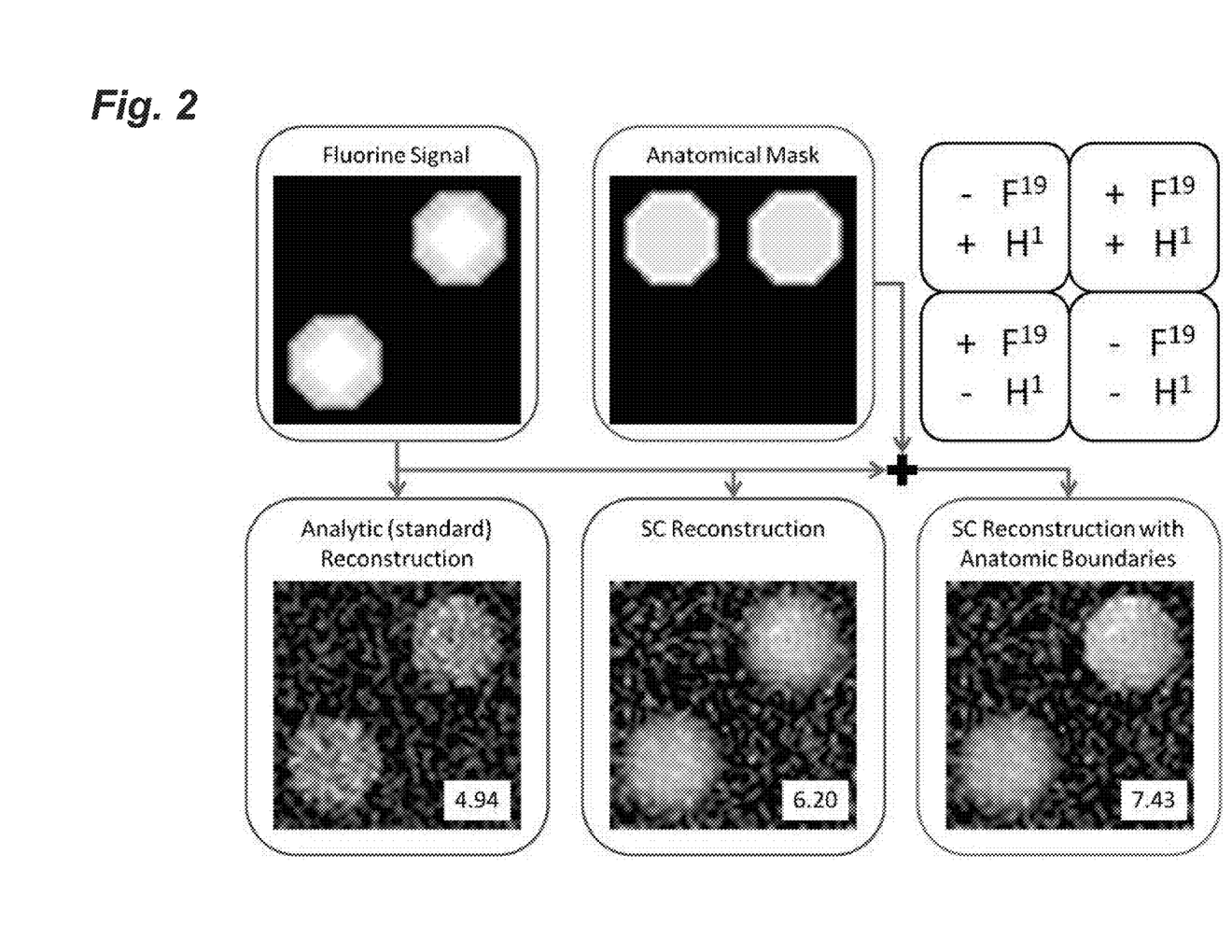
FIG. 2 depicts images utilizing multiple reconstruction techniques including side information from anatomical proton scans in a heteronucleus numerical phantom reconstruction, in accordance with some embodiments of the present disclosure.

FIG. 2 demonstrates the principle of utilizing side information from anatomical proton scans in a heteronucleus numerical phantom reconstruction. Numbers in the bottom right of the reconstructed images represent the SNR of the top-right (i.e., the true-positive) region. As discussed below, for low SNR, the standard analytic reconstruction can be improved by applying smoothness constraints to an iterative reconstruction, with a concurrent loss of resolution. Boundary information from a second (proton) scan can be used to control smoothing across boundaries to better maintain resolution. Note that in the top-left (false-positive) region, edge constraints do not introduce artifacts where signal is not present.

Constrained Smoothing Penalties

In model-based reconstructions, the image can be estimated by minimizing a cost function:

$$\hat{f}=\arg\min_f \|y-Af\|^2+\beta R(f) \quad [1]$$

where y is the data, A is the system matrix, and $f$ is the image we wish to reconstruct. The first part of Eq. 1 is a data fidelity term, which penalizes inconsistency between the image estimate and the observed data. The second part of the equation, $R(f)$, is a regularization term, which can take many forms. The $\beta$ parameter acts to control the influence that the regularization term has on the resulting image estimate.

Side information can be incorporated into the reconstruction through the regularization term, $R(f)$, in Eq. 1. A simple "regularizer" to implement is, for example, a quadratic roughness penalty with the form:

$$R(f)=\|Cf\|_w^2 \quad [2]$$

where C is a differencing matrix and w are weights that control the amount of smoothing. These weights can be used to identify boundaries in the image over which smoothing should not be performed. When the weights, w, are uniform, for example, this regularizer penalizes all roughness (e.g., edges) in the reconstructed image estimate and improves SNR by local signal averaging at the expense of resolution. As discussed above, however, the fluorine signal is expected to remain confined to well-defined regions (e.g., organs and tissues), as opposed to being diffusely spread with equal intensity across known image boundaries. As a result, many different choices can be for w based on the expected distribution of signal. There are many possible approaches to choosing the weighting coefficients based on known anatomy.

In some embodiments, for example, binary weights can be formulated by manual segmentation of regions of interest (ROIs) in the proton images and setting the edges of these ROIs as the boundary locations for $^{19}$F reconstruction. The weight can be 0 or 1 depending on whether an edge is present in the mask or not (e.g., 0 means there is an edge). Conceptually, the weights can prevent smoothing across boundaries, but allow smoothing elsewhere [1].

In other embodiments, the weights can be defined as:

$$w_j=1-N(|Cf|)$$

with N( ) normalizing to a scale between 0 and 1, similar to [2]. The weights can have a value close to 1 in homogenous regions of the image, improving SNR there. At image boundaries, on the other hand, the value of the weights can be reduced towards zero. In other words, the weights can be "analog," varying continuously between edges (0) and areas of high contrast (1). In addition, there can be a larger difference between pixels resulting in a smaller weighting parameter. In other words, stronger contrast between tissues in the proton image can result in stronger enforcement of edge constraints in the fluorine reconstructions. Advantageously, this approach requires little or no operator intervention to manually segment image features of interest. In addition, it can apply different amounts of smoothness in different areas of the image. This technique is nonetheless somewhat dependent on fairly strong contrast between tissues of interest and surrounding tissue.

The quadratic regularizer can be convenient for minimization. One drawback, however, is that it tends to smooth the entire resulting image, with higher β values leading to more smoothing. Pixel-based regularization methods, on the other hand, can improve local SNR, while maintaining image resolution—and improving the sensitivity—of $^{19}$F imaging. While the addition of edge constraints helps, these methods are somewhat limited by the amount of smoothing that can be applied before image quality is degraded. To this end, two additional regularization approaches are described below.

Regularization Towards a Reference

A relatively simple regularization choice (even simpler than the quadratic penalty of Eq. 2) is to bias the reconstruction towards some reference image, $\bar{f}$. In this configuration, the regularizer can be defined as:

$$R(f)=\|f-\bar{f}\|^2 \quad [3]$$

a form of Tikhonov regularization. As $\bar{f}$ is often neglected altogether in practice, the resulting image estimate is generally biased toward zero, possibly reducing image contrast [3]. By carefully choosing the reference image, however, improved results may be obtained.

The strategy proposed in [4], for example, can be used and a denoised version of the image can be used as the reference image:

$$\bar{f}=d(f) \quad [4]$$

where $d(f)$ is the image denoised with some algorithm, of which there are many to choose. One relatively recent denoising algorithm that lends itself easily to the possible incorporation of side information is the non-local means (NLM) filter.

Example-based denoising methods assume that a local image patch should look similar to a weighted sum of some patch dictionary entries which can fully describe image features. These dictionaries can be trained beforehand, for example, on previously acquired images, or can be trained using the noisy image itself. The NLM filter belongs in the latter category, and works on the principle that any local image patch should look substantially similar to other image patches present in the same image [5]. Each patch, x, in the following equation can be reconstructed as a weighted summation of other patches in a search window, V:

$$NLM(x)=\Sigma_{i \in V} w(i,j) x_i \quad [5]$$

The degree of similarity, and thus the summation weight, w, between patches i and j can be determined by the Euclidian distance between the gray levels of the patches:

$$w(i,j)=\frac{1}{z(i)} e^{\frac{\|x_i-x_j\|_2^2}{h}} \quad [6]$$

$$Z(i)=\sum_j w(i,j) \quad [7]$$

where h is a filter parameter related to the noise variance.

Figure 3:
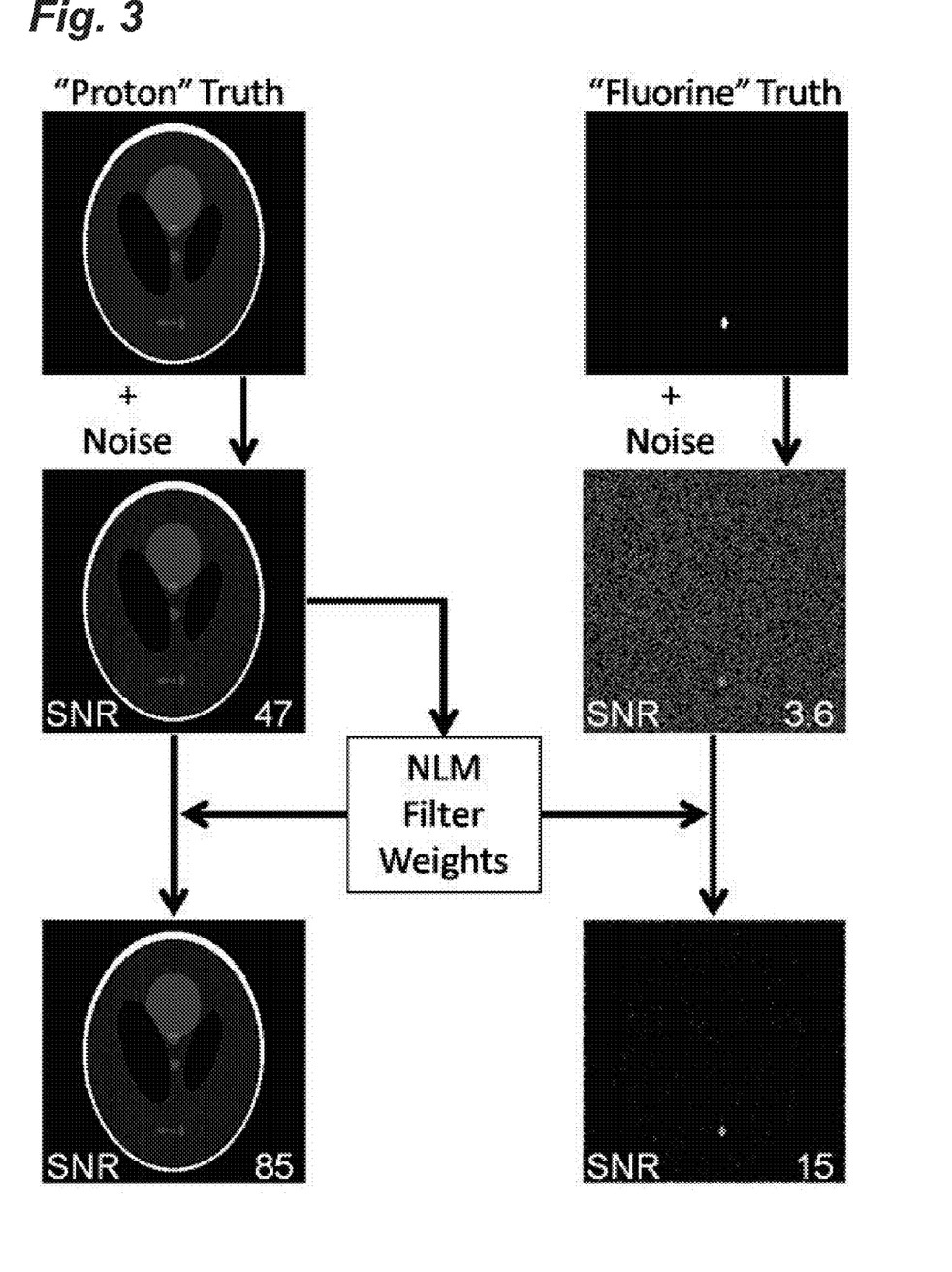
FIG. 3 depicts images reconstructed using second-nucleus denoising using primary anatomic information with filter weights derived from a high-SNR, high-spatial-information "proton" image, in accordance with some embodiments of the present disclosure.

To pull side information into the algorithm and apply the filter to low-SNR $^{19}$F data, which generally does not contain much spatial information, the training step of the filter can first be used on a high-SNR, high-spatial-information proton image. The calculated filter weights can be saved and then can be used to guide the fluorine filter by describing, for any individual patch, which other patches in the fluorine image should be similar and how to combine them. FIG. 3 illustrates this process using a numerical phantom example. To achieve this, Eq. 5 can be modified such that:

$$NLM(x,y)=\Sigma_{i\in V} w_y(i,j)x_i \quad [8]$$

that is, each patch in the fluorine image can be reconstructed as a weighted summation of other patches in the image, but the weights are derived from the anatomical proton image.

The simplified approach presented in Eq. 8, and shown in FIG. 3, assumes local image patterns in the proton image can be directly used as examples for the fluorine reconstruction. There are cases, however, where this may not hold true. In addition, it is desirable to minimize artifacts due to the NLM filter itself. As a result, the side-information-trained NLM filtered image, as described above, can be used as the reference image instead. Combining these concepts, therefore, the cost function can be minimized is:

$$\hat{f}=\arg\min_f \|y-Af\|^2+\beta\|f-NLM(f,p)\|^2 \quad [9]$$

Sparsifying Constraints

The aforementioned low SNR of $^{19}F$ images makes it desirable to apply denoising methods in a post-processing step to the resulting images. Denoising low-SNR data can be difficult, however, when, for example, image features (e.g., edges) compete with local intensity gradients due to noise. Compressed sensing has emerged as a method by which an image may be reconstructed from non-Nyquist-sampled data by exploiting sparsity [6]. A significant benefit in MRI applications has been to speed up acquisitions by reducing the amount of data that must be acquired to generate a useful image. The technique can also be applied, however, to image denoising as the sparsity constraint imposed by the reconstruction naturally suppresses noise-like signal. By virtue of there being no, or no detectable, background signal, $^{19}F$ images are generally sparse, lending themselves to image-domain constraints on sparsity. As described in [7], therefore, an L1-norm penalty and a total-variation penalty can be applied to the cost function in order to enforce sparsity as shown in Eq. 10:

$$\hat{f}=\arg\min_f \|y-Af\|^2-\beta_1\|f\|_1+\mu_2\|Cf\|_1 \quad [10]$$

where, again, C is a differencing matrix. Enforcing sparsity can improve image quality through denoising, but on its own, does not utilize side information to guide this denoising process. In some embodiments, therefore, a combination of sparsifying constraints plus side-information constraints can be used to yield high-quality reconstructions.

EXEMPLARY IMPLEMENTATIONS AND RESULTS

The following describes examples of practicing concepts and technologies presented herein, and corresponding results, in accordance with aspects of the present disclosure.

The constrained reconstructions, discussed above, can be tested theoretically in Matlab (or similar) using numerical phantoms. A full Shepp-Logan phantom with a small amount of added noise can be used to simulate a "proton" image. A second image with a small non-zero ellipse and a large amount of added noise can be used for a "fluorine" image. To compare all of the regularization methods discussed, the phantoms were reconstructed using:

1. A standard iFFT reconstruction.
2. A side-information-constrained quadratic smoothness regularizer. The edge weights were determined from an edge detection function, edge( ), available in Matlab from the fluorine "truth" image (this mimics manual segmentation of the proton image).
3. A reconstruction biased towards a denoised version of the iFFT image. The denoising algorithm used was NLM using the proton image to train the filter weights.
4. A sparse reconstruction with an L1-norm penalty as well as a total-variation penalty.
5. A combination of the penalties from reconstructions 3 and 4.

For reconstructions 2-4, the penalty weights were adjusted such that the SNR of the positive region was approximately the same. The following parameters were recorded:
  SNR,
  root-mean-square error (RMSE) between the reconstructed image and the true image, and
  the sharpness of the image—as determined by the mean gradient across the positive ellipse.

Nanoparticle Design and Synthesis

For in vivo studies, fluorine nanoparticles were manufactured in-house with the general design of a lipid monolayer shell surrounding a liquid perfluorocarbon core composed of perfluoro-15-crown-5-ether (CE). Crown ether supplies a single resonance peak, which maximizes MR signal detection. The nanoparticle shell design consisted of a 1:1 mixture of distearoylphosphatidylcholine (DSPC) and dioleoylphosphatidylcholine (DOPC) lipids. The mean particle size was 143 nm, determined via dynamic light scattering. The nanoparticle manufacturing process consisted of guiding a 4% wt/wt solution of shell compounds along with the CE (10% wt/wt) through a Nuclepore filter 41 times.

MRI Equipment

All MR studies were performed on a Siemens/Bruker Clinscan MRI system. The system is equipped with a 7.0 T Bruker 30 cm bore magnet, Bruker actively shielded gradients (maximum strength of 400 mT/m, rise time of 80 μs, inner diameter=12 cm). A Bruker dual-tuned, transmit/receive, $^1H/^{19}F$, volume coil insert was used for fluorine imaging.

Animal Handling Procedures

Standard animal preparation techniques and NIH guidelines were adhered to for all animal studies. Mice were maintained under anesthesia using 1-2% inhaled isofluorane during all imaging sessions. The animals received constant monitoring of ECG and respiratory state (SA Instruments), and warm water was circulated to maintain body temperature. For each imaging session, the mouse was positioned prone inside the $^1H/^{19}F$ volume coil. A conventional proton MRI "scout" images were obtained for later positioning of the 19F acquisitions.

Infarct Imaging

To assess the utility of cardiovascular $^{19}F$ imaging and the advanced reconstruction methods discussed above, an experiment involving in vivo macrophage labeling and tracking to a myocardial infarct (MI) was performed. Imaging after an MI involves a high level of acute inflammation, resulting in significant monocyte migration to the infarct location in the days immediately following an MI.

Myocardial infarction was surgically induced in C57Bl/6 mice by a one-hour arterial occlusion followed by reperfusion. A 300 μl volume of CE nanoparticle emulsion was injected intravenously 24 hours post-surgery. Imaging was performed 4 and 8 days post-surgery to allow time for macrophage phagocytosis of nanoparticles and recruitment into damaged myocardium. For $^{19}F$, a 2D turbo spin echo (TSE) sequence was prescribed as closely to that described by [7] as possible for comparative purposes.

Scan parameters were: resolution 0.5 $mm^2$, slice thickness 2 mm, 3 slices, TR/TE=4500/5 ms, 256 averages, scan time 19:12 minutes, and no cardiac gating. Next, a gated 3D TSE sequence [8]e was applied with scan parameters: Resolution 0.5 mm³, TR/TE=3000/2.5 ms, 5 averages, scan time 11:44 minutes, and the sequence was run on the subsequent cardiac trigger following wait time TR.

Image Reconstruction

Fluorine images (both 2D and resliced 3D) were reconstructed via (1) conventional inverse Fast Fourier Transform (iFFT) reconstruction, (2) a smoothness-constrained reconstruction (i.e. unitary edge weights, w), (3) a constrained reconstruction with binary edge weights calculated from manually-segmented image boundaries from the proton localizer, and (4) a constrained reconstruction with automatic calculation of edge weights from the proton localizer.

Figure 4:
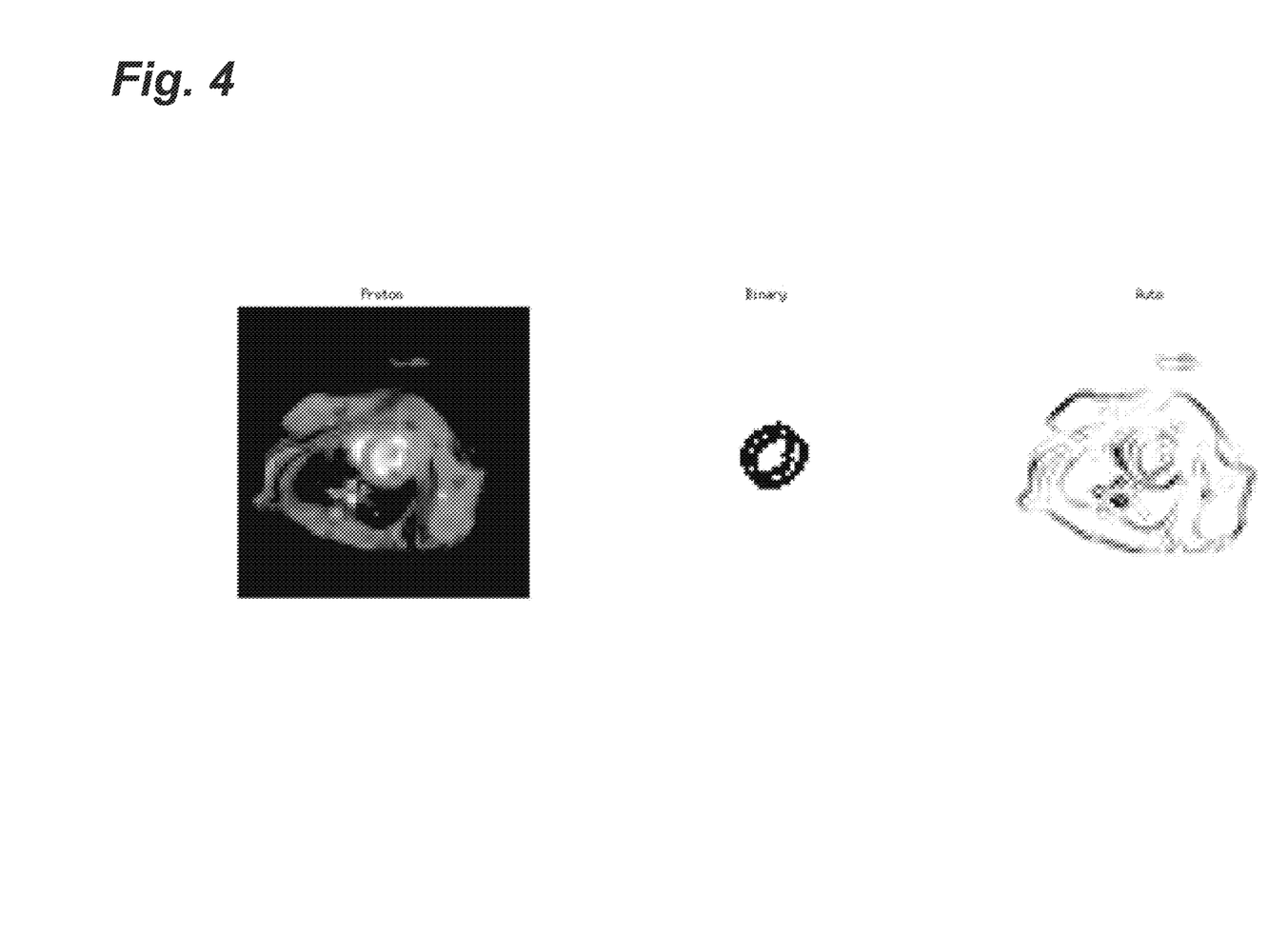
FIG. 4 depicts images reconstructed using a proton localizer, binary edge weights, and automatic edge weights, in accordance with some embodiments of the present disclosure.

FIGS. 4A-4C shows the proton scout image, the binary edge weights, and the automatically-calculated edge weights, respectively. All reconstructions were performed in Matlab and minimization of the image estimate cost function was carried out using a modified version of the nonlinear conjugate gradient descent algorithm with backtracking line search available as part of the SparseMRI package.[1]

SparseMRI is available from Dr. Michael Lustig. See, http://www.eecs.berkeley.edu/mlustig/Software.html.

For quadratic roughness penalties, there is a well-developed theory for choosing beta based on the desired resolution properties of the image. Here, a slight resolution loss is accepted to boost SNR. Edge restraints can then be used to restore resolution to a satisfactory level. Beta is chosen such that the full width at half maximum (FWHM) of the point spread function (PSF) was approximately 1.3 mm (the normal mouse myocardial wall thickness is on the order of 1-2 mm). This provides a good SNR improvement, yet maintains overall image quality. SNR was calculated as the mean signal in the myocardium (determined from the same myocardial mask used in the masked reconstruction) divided by the standard deviation of a region outside the mouse body.

Figure 8:
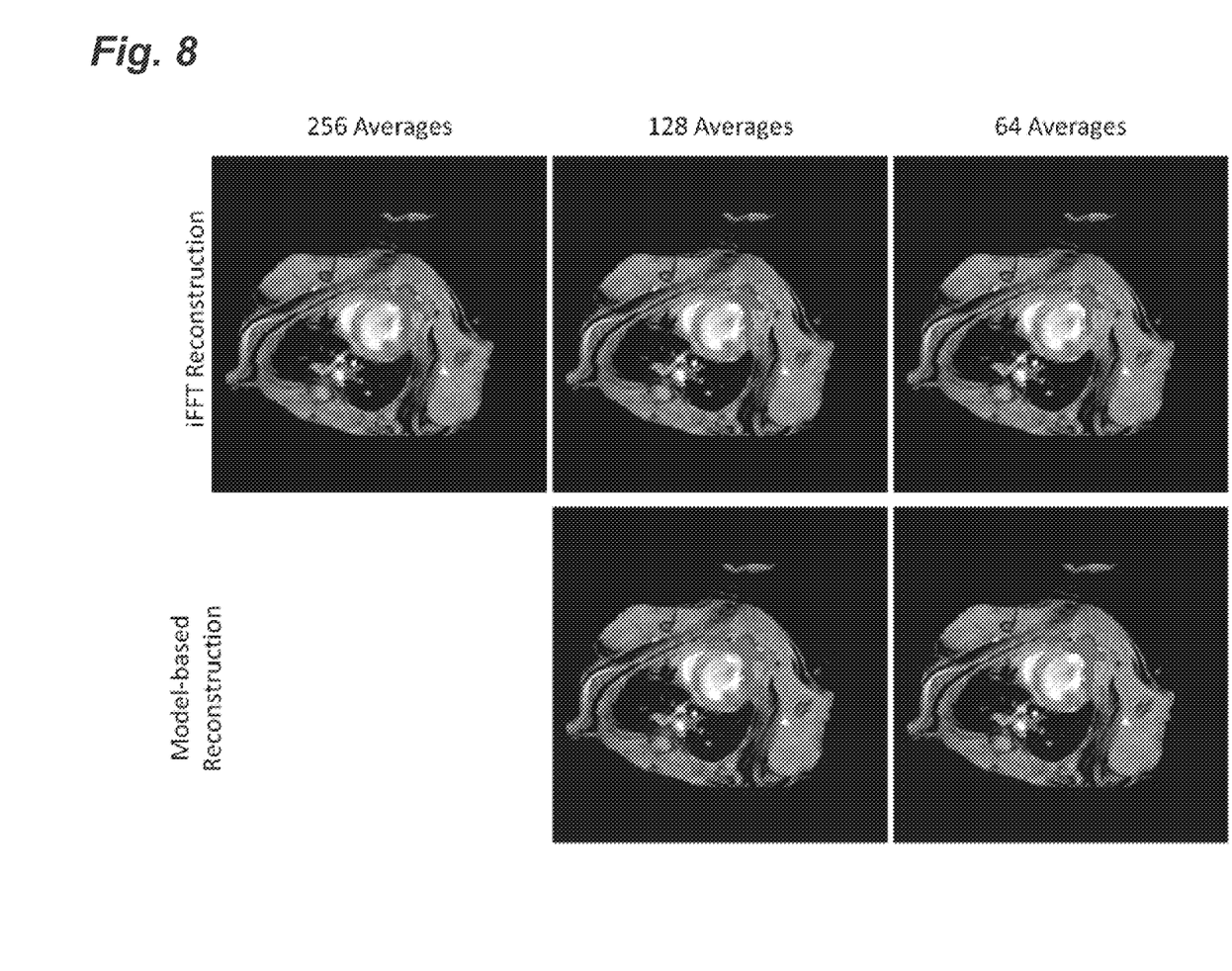
FIG. 8 depicts reconstructions of in vivo data with varying SNR, in accordance with some embodiments of the present disclosure.

To demonstrate the ability of model-based reconstructions to recover signal from low-SNR data, the 2D TSE myocardial data (collected with 256 averages) was iFFT reconstructed with 256, 128, and 64 averages. For the 128- and 64-averages data, images were also reconstructed using reconstruction #5, described above. The number of pixels positive for ¹⁹F was recorded as a surrogate for detection sensitivity, with the 256-average iFFT reconstruction image used as the benchmark. A pixel was considered positive for ¹⁹F if its value was four standard deviations above the noise or higher.

EXAMPLES

Figure 5:
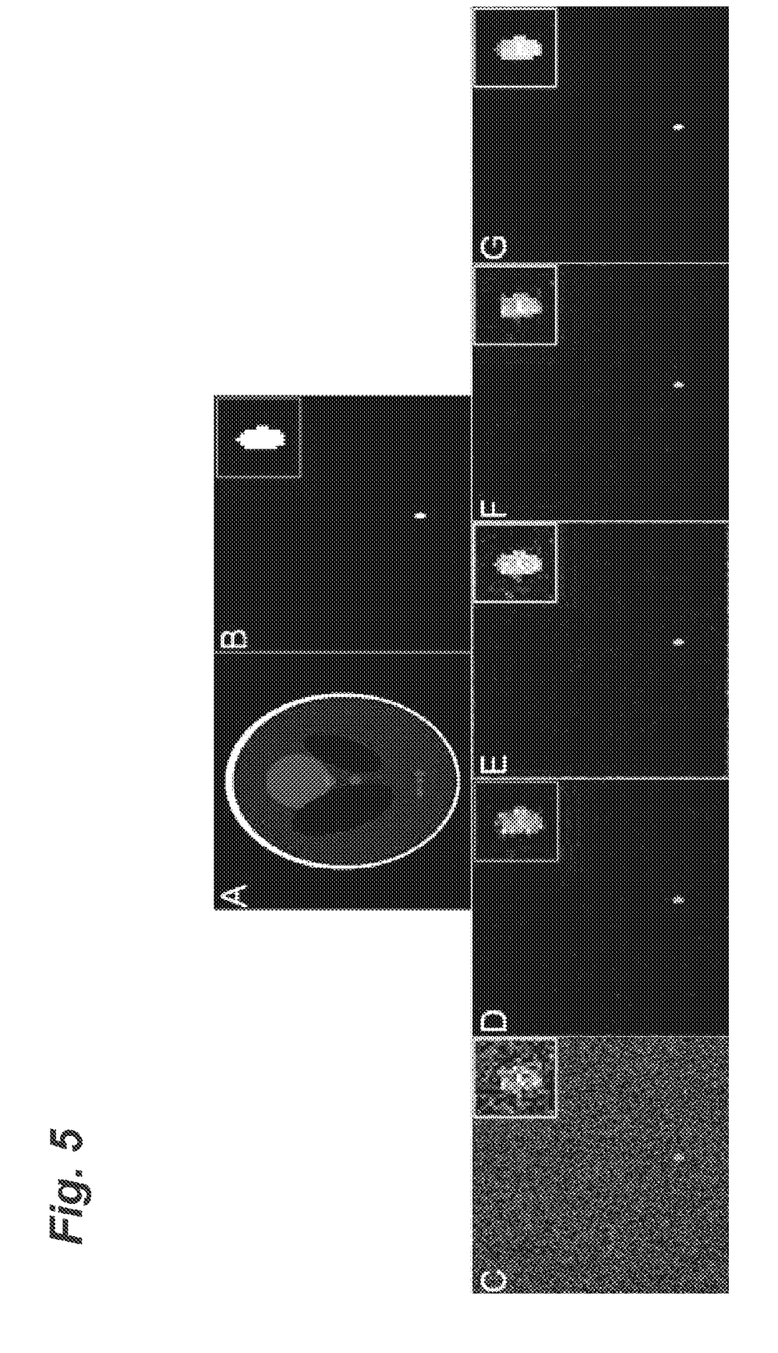
FIG. 5 depicts constrained model-based reconstructions in a numerical phantom image, in accordance with some embodiments of the present disclosure.

All four constrained reconstruction methods are shown in FIG. 5. From this figure, it is clear that all model-based reconstructions out-perform a simple iFFT reconstruction. As discussed above, a disadvantage of the edge-information-constrained quadratic smoothness regularizer is an edge mask bleed-through artifact. This phenomenon is visible in this FIG. 5D. In FIG. 5E, on the other hand, it is apparent that biasing the reconstruction towards a denoised version of the iFFT reconstruction is promising. Close scrutiny reveals image features from the proton image, for example, that are visible as variations in noise texture throughout the image.

It was found that the sizes of both the local search window and the patch size had a strong impact on the appearance of these artifacts. For standard image denoising of the proton image, for example, a search window of 9×9 with a patch size of 3×3 resulted in good denoising without artifacts. When these parameters were applied to noisy fluorine data, however, image features from the proton image became visible as variations in noise texture. Reducing the search window to 5×5 and the patch size to 1×1 alleviated this effect.

The result of applying sparsity constraints to the reconstruction are shown in FIG. 5F. While good results are obtained, this reconstruction utilizes no side-information from the "proton" image, and thus fails in the top-most portion of the ellipse. In this location, random noise variations have suppressed the signal. Finally, combining the sparsity constraints with a bias towards a denoised image appears to give the best results. These results are quantified in Table 1, below.

TABLE 1

Quantification of image features in FIG. 5

| Reconstruction | SNR | RMSE[2] | Sharpness[3] |
|---|---|---|---|
| iFFT | 4.23 | 5.65 | 1.12 |
| Smoothness | 12.2 | 1.72 | 0.72 |
| NLM | 12.3 | 2.09 | 0.82 |
| Sparsity | 12.2 | 0.88 | 0.46 |
| Sparsity + NLM | 40.8 | 0.31 | 0.60 |

[2]RMSE is the error between the reconstructed image and the noise-free, true image.
[3]The ideal sharpness value is 1 (the iFFT reconstruction's sharpness exceeds this due to noise).

Figure 6:
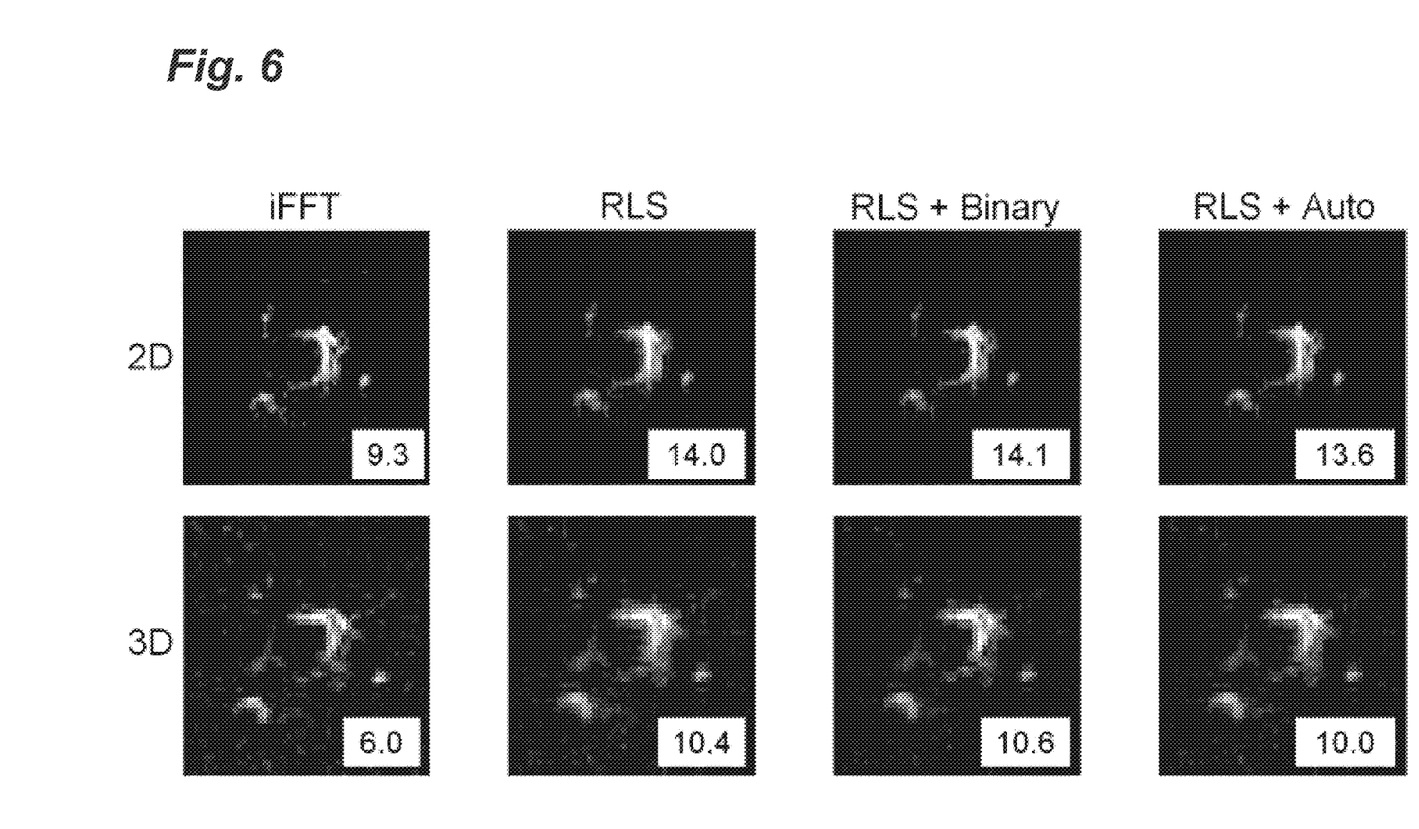
FIG. 6 depicts reconstructions of $^{19}$F signal in vivo, in accordance with some embodiments of the present disclosure.
Figure 7:
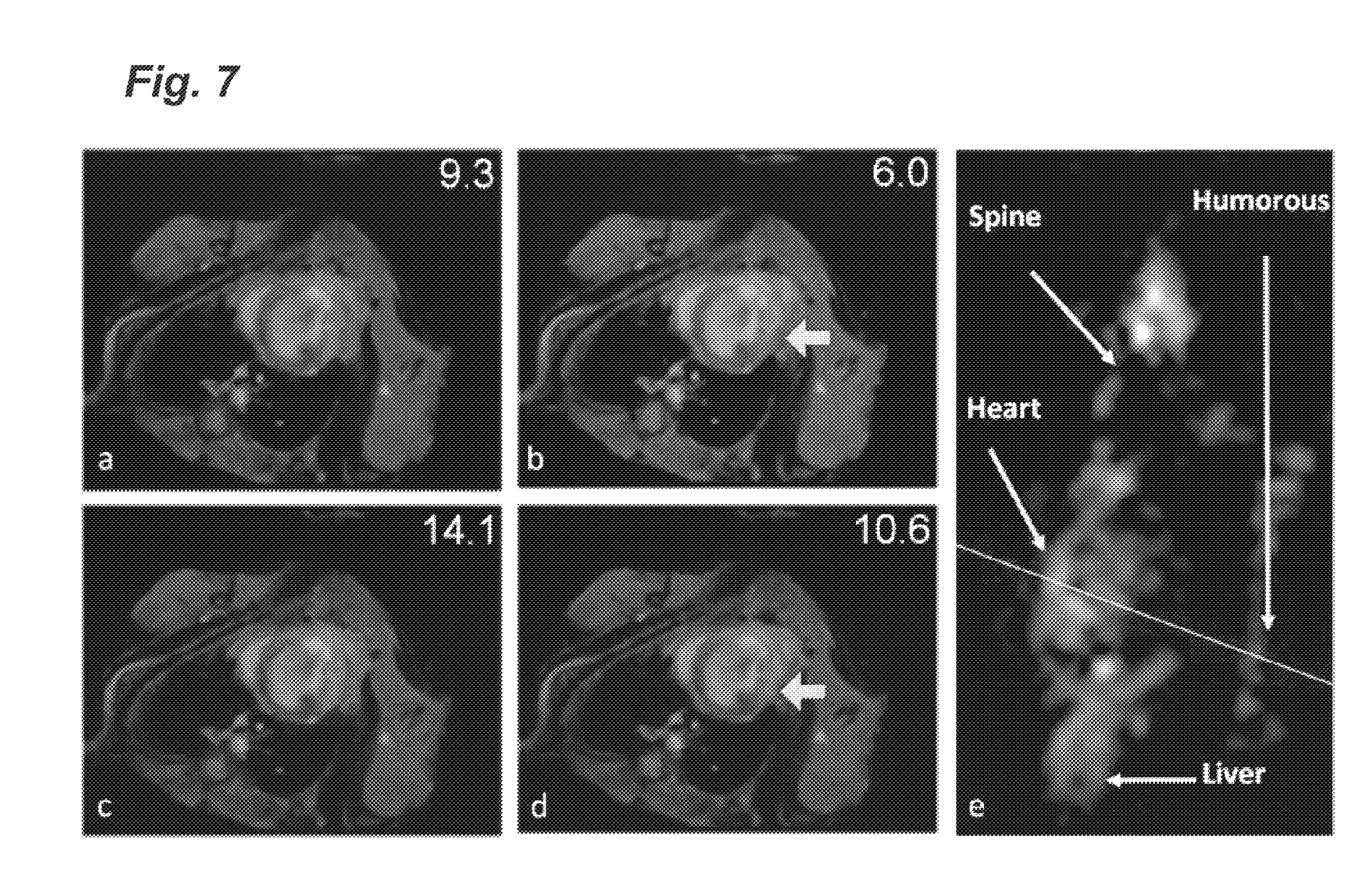
FIG. 7 depicts macrophage tracking with fluorine nanoparticles in an infarct model, in accordance with some embodiments of the present disclosure.

In vivo results comparing the standard iFFT with the various constrained reconstructions are shown in FIG. 6. As shown, the SNR of the myocardial region is improved in each of the smoothness-constrained reconstructions. The boundary sharpness is nonetheless better maintained through the use of edge weights. The use of binary edge weights results in slightly better performance compared to the automatic method. The use of binary edge weights presents some risk of mask "bleed-through," however, if too-high a β value is chosen. See, e.g., FIG. 5D.

FIGS. 7A-7D simply overlay selections from FIG. 6 onto the proton localizer for ease of visualization. The model-based reconstruction improved myocardial SNR by 52% for the 2D image and 77% for the 3D image. Taking the 2D image as the benchmark, it is clear that the addition of edge constraints in a regularized least squares reconstruction extends the visible area of fluorine signal in the lower-SNR 3D images. As shown in FIG. 7E, the 3D technique is a "whole-mouse" technique with a much greater imaging volume than its 2D counterpart.

The results of applying the NLM+Sparsity constrained reconstruction on in vivo data is shown in FIG. 8. As expected, lowering the SNR by reconstructing the image with fewer averages has the effect of reducing the number of positive ¹⁹F pixels. See, also, Table 2, below. The model-based reconstruction successfully recovers many of the "lost" pixels.

TABLE 2

Number of positive ¹⁹F pixels in FIG. 8

| Reconstruction | 256 Averages | 128 Averages | 64 Averages |
|---|---|---|---|
| iFFT | 739 | 380 | 177 |
| Model | | 913 | 369 |

[4]A positive pixel is one with a value greater than four standard deviations of the noise.

Figure 9:
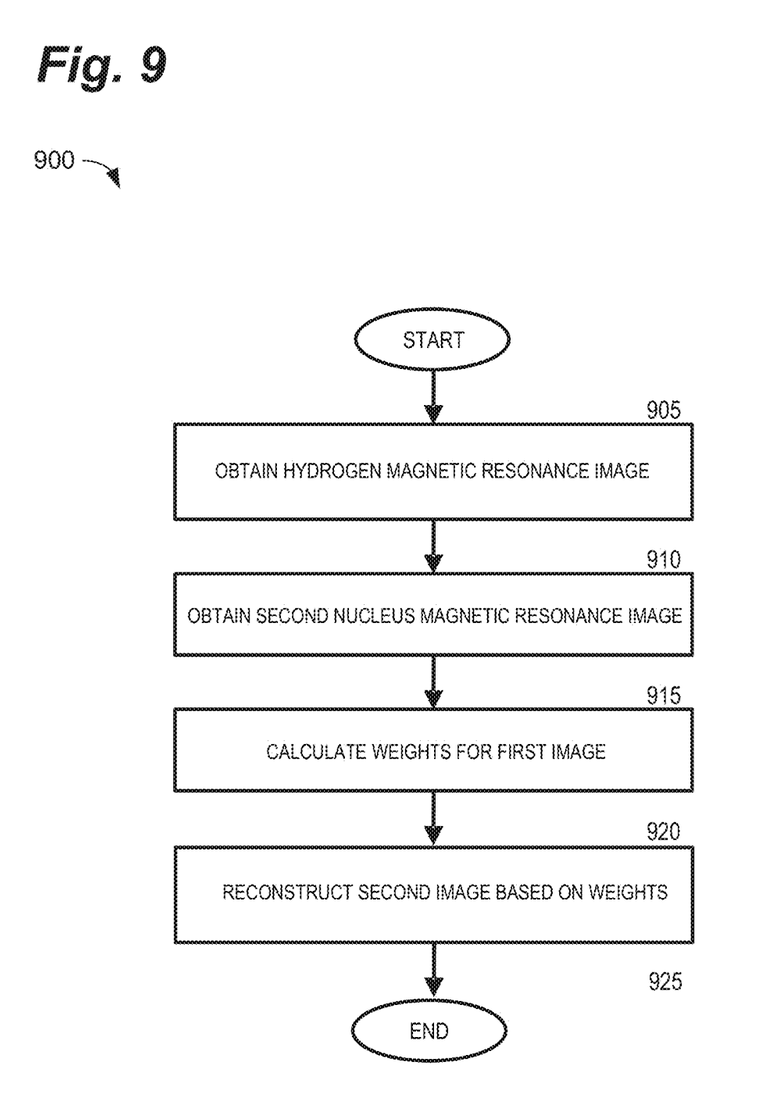
FIG. 9 is a flowchart depicting a method of reconstructing MRI images, in accordance with some embodiments of the present disclosure.

Embodiments of the present disclosure can also comprise a method 900 for reconstructing second nucleus (e.g., ¹⁹F images) using hydrogen MRI. In some embodiments, a hydrogen ($^1$H) MRI of the subject can be obtained 905 as a base image. As discussed above, $^1$H MRIs can provide good, high-resolution images for use as a "reference" image. The subject can then be scanned using a secondary nucleus 910, such as $^{19}$F, for example. A plurality of weights can then be calculated 915 using the first image to provide side information for the second image. Using this side information, the second image can be reconstructed 920 to provide improved resolution and clarity. In some embodiments, the images can be combined to provide detail that would not otherwise be available in a single nuclei image.

CONCLUSION

Embodiments of the present disclosure relate to the use of anatomic side information from proton images to assist the reconstruction of MRI of heteronuclei. As discussed above, for low-SNR $^{19}$F data, iFFT reconstructions can be improved upon by exploiting additional information related to the image. Namely, SNR can be improved over a standard reconstruction through model-based reconstruction methods that incorporate prior knowledge into the reconstruction. Constrained smoothness regularizers can average the signal locally and use edge information to regain some of the resolution loss incurred by the smoothing. Biasing reconstruction towards a denoised version of the image can be effective. In addition, incorporating side information through the denoising algorithm can also be effective. Finally, the natural sparsity present in $^{19}$F images can be exploited to further improve image quality. These constraints need not be applied individually, however, as better results can be obtained by combining multiple regularization methods.

In vivo, the use of automatic weights is improved with good contrast in the proton image, i.e., between tissues where fluorine is expected and where it is not. As shown in FIGS. 4 and 6, it is clear that the infarcted region of the myocardium had the least amount of contrast with surrounding tissue, resulting in blurring of the $^{19}$F signal in that area. Different Proton scan(s), performed in conjunction with the fluorine scan, can be chosen to improve these results. These can include, for example and not limitation, high-resolution late-gadolinium-enhanced images or a $T_2$-weighted edema images of the myocardium. This can enable further restriction of the fluorine reconstruction to the infarct zone.

In addition to their possible use in clinical settings, robust molecular and cellular imaging methods already have great utility in preclinical work. Questions regarding when and how genes, proteins, and cells are activated in response to various physiological stimuli can be investigated directly in vivo. The ability to observe cellular and molecular activities in vivo is a powerful tool in gaining understanding of normal and abnormal functions of the body on the smallest scale and has impact in virtually every field of medicine. As discussed, second-nucleus imaging with MR, and in particular $^{19}$F imaging, is a promising method that shares some properties with multi-modality imaging systems such as PET- and SPECT-CT and -MR, without the use of probes, ionizing radiation, or toxicity concerns.

While several possible embodiments are disclosed above, embodiments of the present disclosure are not so limited. For instance, while the above techniques are described for use with $^{19}$F MRI imaging using a proton "base" scan, other heteronuclei and other base scan techniques could be used. In addition, while certain smoothing and denoising techniques, and combinations thereof, have been disclosed, other techniques and other combinations could be used. The techniques and steps described herein could also be used at different resolutions or in different order.

The specific configurations, choice of materials and chemicals, and the size and shape of various elements can be varied according to particular design specifications or constraints requiring a system or method constructed according to the principles of the disclosure. For example, while certain exemplary ranges have been provided for the search windows and patch sizes, for example, other resolutions could be used depending on the application and the desired final image resolution. Such changes are intended to be embraced within the scope of the disclosure. The presently disclosed embodiments, therefore, are considered in all respects to be illustrative and not restrictive. The scope of the invention is indicated by the appended claims, rather than the foregoing description, and all changes that come within the meaning and range of equivalents thereof are intended to be embraced therein.

LIST OF REFERENCES

1. Dewaraja Y K, Koral K F, Fessler J a. Regularized reconstruction in quantitative SPECT using CT side information from hybrid imaging. Physics in medicine and biology. 2010 May 7; 55(9):2523-39.
2. Haldar J P, Hernando D, Song S K, Liang Z P. Anatomically constrained reconstruction from noisy data. Magnetic Resonance in Medicine. 2008 April; 59(4):810-8.
3. Fessler J A. A review of the use of iterative algorithms]. IEEE Signal Processing Magazine. 2010; 936726 (July): 81-9.
4. Rousseau F. A non-local approach for image super-resolution using intermodality priors. Med Image Anal. 2010 August; 14(4):594-605.
5. Buades A, Coll B, Morel J. A Review of Image Denoising Algorithms, with a New One. Multiscale Modeling & Simulation. 2005; 4(2):490-530.
6. Lustig M, Donoho D, Pauly J M. Sparse MRI: The Application of Compressed Sensing for Rapid MR Imaging. 2007; 1195:1182-95.
7. Flogel U, Ding Z, Hardung H, Jander S, Reichmann G, Jacoby C, et al. In vivo monitoring of inflammation after cardiac and cerebral ischemia by fluorine magnetic resonance imaging. Circulation. 2008 July; 118(2):140-8.
8. Fielden S, Klibanov A, Epstein F, Xu Y, French B, Meyer C. 3D acquisitions improve sensitivity and coverage in cardiac 19F Imaging. Soc of Nucl Med: Multimodality Cardiovascular Molecular Imaging Symbosium. 2012. p. 10.

What is claimed is:

1. A method comprising:
   obtaining a first magnetic resonance (MRI) image using hydrogen (1H);
   obtaining a second MRI image using a secondary nucleus other than hydrogen; and
   reconstructing the second image using side information from the first image, wherein reconstructing the second image comprises regularizing the image using a quadratic roughness penalty, and wherein the quadratic roughness penalty comprises a differencing matrix and a plurality of weights.
2. The method of claim 1, wherein the secondary nucleus is Fluorine-19 (19F).
3. The method of claim 1, wherein the secondary nucleus is one or more selected from the group consisting of sodium (23Na), carbon (13C), phosphorus (31P), helium (3He), and xenon (129Xe).

4. The method of claim 1, wherein the plurality of weights are binary;
    wherein a first weight of the plurality of weights is set to 0 if the side information from the first image indicates an edge; and
    wherein a second weight of the plurality of weights is set to 1 if the side information from the first image does not indicate an edge.

5. The method of claim 1, wherein each weight in the plurality of weights varies continuously between 0 and 1 based on the side information from the first image.

6. The method of claim 5, wherein the higher the contrast in the side information of the first image, the closer a first weight of the plurality of weights is to 0; and wherein the lower the contrast in the side information of the first image, the closer a first weight of the plurality of weights is to 1.

7. The method of claim 1, wherein reconstructing the second image comprises:
    filtering the first image using a filter to obtain a plurality of calculated filter weights; and
    filtering the second image using the filter and the calculated filter weights from the first image.

8. The method of claim 7, wherein the filter comprises a non-local-means (NLM) filter.

9. The method of claim 1, further comprising including terms in the cost function of the image reconstruction to enforce sparsity.

10. The method of claim 9, wherein the sparsity is in the image domain.

11. The method of claim 9, wherein the sparsity is enforced using an L1 norm.

12. A system, comprising:
    a magnetic resonance imaging (MRI) device;
    one or more processors; and
    at least one memory in communication with the MRI device, storing computer-readable instructions that, when executed by the one or more processors, cause the system to:
        obtain a first magnetic resonance (MRI) image using hydrogen (1H);
        obtain a second MRI image using a secondary nucleus other than hydrogen; and
        reconstruct the second image using side information from the first image, wherein reconstructing the second image comprises regularizing the image using a quadratic roughness penalty, and wherein the quadratic roughness penalty comprises a differencing matrix and a plurality of weights.

13. The system of claim 12, wherein the secondary nucleus is Fluorine-19 (19F).

14. The system of claim 12, wherein the secondary nucleus is one or more selected from the group consisting of sodium (23Na), carbon (13C), phosphorus (31P), helium (3He), and xenon (129Xe).

15. The system of claim 12, wherein the plurality of weights are binary;
    wherein a first weight of the plurality of weights is set to 0 if the side information from the first image indicates an edge; and
    wherein a second weight of the plurality of weights is set to 1 if the side information from the first image does not indicate an edge.

16. The system of claim 12, wherein each weight in the plurality of weights varies continuously between 0 and 1 based on the side information from the first image.

17. The system of claim 16, wherein the higher the contrast in the side information of the first image, the closer a first weight of the plurality of weights is to 0; and wherein the lower the contrast in the side information of the first image, the closer a first weight of the plurality of weights is to 1.

18. The system of claim 12, wherein reconstructing the second image comprises:
    filtering the first image using a filter to obtain a plurality of calculated filter weights; and
    filtering the second image using the filter and the calculated filter weights from the first image.

19. The system of claim 18, wherein the filter comprises a non-local-means (NLM) filter.

20. The system of claim 12, further comprising including terms in the cost function of the image reconstruction to enforce sparsity.

21. The system of claim 20, wherein the sparsity is in the image domain.

22. The system of claim 20, wherein the sparsity is enforced using an L1 norm.

23. A method comprising:
    obtaining a first magnetic resonance (MRI) image using hydrogen (1H);
    obtaining a second MRI image using a secondary nucleus other than hydrogen; and
    reconstructing the second image using side information from the first image, wherein reconstructing the second image comprises:
        filtering the first image using a filter to obtain a plurality of calculated filter weights, and
        filtering the second image using the filter and the calculated filter weights from the first image.

24. The method of claim 23, further comprising including terms in the cost function of the image reconstruction to enforce sparsity.

25. A system, comprising:
    a magnetic resonance imaging (MRI) device;
    one or more processors; and
    at least one memory in communication with the MRI device, storing computer-readable instructions that, when executed by the one or more processors, cause the system to:
        obtain a first magnetic resonance (MRI) image using hydrogen (1H);
        obtain a second MRI image using a secondary nucleus other than hydrogen; and
        reconstruct the second image using side information from the first image, wherein reconstructing the second image comprises:
            filtering the first image using a filter to obtain a plurality of calculated filter weights, and
            filtering the second image using the filter and the calculated filter weights from the first image.

* * * * *